(12) United States Patent
Schuerz

(10) Patent No.: US 9,855,591 B2
(45) Date of Patent: Jan. 2, 2018

(54) METHOD FOR PRODUCING A SOLID ACTUATOR

(71) Applicant: Continental Automotive GmbH, Hannover (DE)

(72) Inventor: Willibald Schuerz, Pielenhofen (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 354 days.

(21) Appl. No.: 14/414,516

(22) PCT Filed: Jul. 3, 2013

(86) PCT No.: PCT/EP2013/064074
§ 371 (c)(1),
(2) Date: Jan. 13, 2015

(87) PCT Pub. No.: WO2014/009228
PCT Pub. Date: Jan. 16, 2014

(65) Prior Publication Data
US 2015/0190857 A1    Jul. 9, 2015

(30) Foreign Application Priority Data
Jul. 13, 2012    (DE) .................... 10 2012 212 264

(51) Int. Cl.
*B21D 15/00* (2006.01)
*H01L 41/053* (2006.01)
(Continued)

(52) U.S. Cl.
CPC ............. *B21D 15/00* (2013.01); *B21D 51/16* (2013.01); *H01L 41/0536* (2013.01);
(Continued)

(58) Field of Classification Search
CPC ......... B21D 15/00; B21D 51/16; H01L 41/23; H01L 41/0536; F02M 2200/9061
See application file for complete search history.

(56) References Cited

U.S. PATENT DOCUMENTS

| 4,813,601 A | 3/1989 | Schwerdt et al. ............... 239/91 |
| 4,858,439 A | 8/1989 | Sawada et al. ................. 60/583 |

(Continued)

FOREIGN PATENT DOCUMENTS

| CA | 2473639 A1 | 11/2004 | ............. F02M 61/10 |
| CN | 101044313 A | 9/2007 | ............. F02M 45/08 |

(Continued)

OTHER PUBLICATIONS

Chinese Office Action, Application No. 201380037481.7, 11 pages, dated Apr. 5, 2017.

(Continued)

*Primary Examiner* — Moshe Wilensky
(74) *Attorney, Agent, or Firm* — Slayden Grubert Beard PLLC

(57) ABSTRACT

A solid actuator has an actuator structural unit, a top plate and a base plate. A hollow cylinder part made of maraging steel is heated to a predetermined first temperature at which the maraging steel is in an austenitic state. A corrugated tube is shaped from the hollow cylinder part by a shaping process, while the maraging steel is still in an austenitic state. The corrugated tube is cooled such that the maraging steel is in a martensitic state. The actuator structural unit is inserted into the corrugated tube. The top plate and the base plate are fixed to the corrugated tube such that the actuator structural unit is clamped between the top plate and the base plate at a predetermined pre-tension.

5 Claims, 3 Drawing Sheets

(51) Int. Cl.
*H01L 41/23* (2013.01)
*B21D 51/16* (2006.01)
*F02M 51/06* (2006.01)

(52) U.S. Cl.
CPC ......... *H01L 41/23* (2013.01); *F02M 51/0603* (2013.01); *F02M 2200/21* (2013.01); *F02M 2200/9061* (2013.01); *Y10T 29/49826* (2015.01)

(56) References Cited

U.S. PATENT DOCUMENTS

| | | | | |
|---|---|---|---|---|
| 5,697,554 | A | 12/1997 | Auwaerter et al. | 239/88 |
| 6,168,132 | B1 | 1/2001 | Frank et al. | 251/33 |
| 6,172,445 | B1 | 1/2001 | Heinz et al. | 310/328 |
| 6,290,204 | B1 | 9/2001 | Kienzler et al. | 251/57 |
| 6,302,333 | B1 | 10/2001 | Hoffmann et al. | 239/88 |
| 6,661,159 | B2 | 12/2003 | Yamada | 310/328 |
| 6,679,440 | B2 | 1/2004 | Igashira et al. | 239/533.2 |
| 6,739,575 | B2 | 5/2004 | Cotton, III et al. | 251/129.06 |
| 6,832,749 | B2 | 12/2004 | Schuerg et al. | 251/129.06 |
| 7,290,530 | B2 | 11/2007 | Boecking | 123/467 |
| 7,429,815 | B2 | 9/2008 | Gibson et al. | 310/344 |
| 7,527,210 | B2 | 5/2009 | Ricco et al. | 239/96 |
| 7,898,152 | B2 | 3/2011 | Stocker et al. | 310/328 |
| 7,926,737 | B2 | 4/2011 | Stoecklein et al. | 239/96 |
| 8,201,543 | B2 | 6/2012 | Morris et al. | 123/494 |
| 8,201,753 | B2 | 6/2012 | Heinz et al. | 239/102.2 |
| 8,998,115 | B2 | 4/2015 | Salcedo et al. | 239/585.2 |
| 2002/0005188 | A1 | 1/2002 | Murakami et al. | 123/506 |
| 2002/0134954 | A1 | 9/2002 | Kienzler | 251/57 |
| 2004/0079815 | A1 | 4/2004 | Hohl | 239/102.2 |
| 2006/0169802 | A1 | 8/2006 | Pauer | 239/533.2 |
| 2007/0131800 | A1 | 6/2007 | Boecking | 239/533.2 |
| 2007/0283803 | A1 | 12/2007 | Moritz | 92/34 |
| 2008/0093482 | A1 | 4/2008 | Boecking | 239/585.5 |
| 2008/0093483 | A1 | 4/2008 | Boecking | 239/585.5 |
| 2009/0266921 | A1 | 10/2009 | Boecking | 239/585.5 |
| 2010/0006675 | A1 | 1/2010 | Boecking | 239/533.2 |
| 2012/0160214 | A1 | 6/2012 | Salcedo et al. | 123/446 |

FOREIGN PATENT DOCUMENTS

| | | | | |
|---|---|---|---|---|
| CN | 101054942 A | 10/2007 | ............ | F02M 61/20 |
| CN | 201090729 Y | 7/2008 | ................ | F16J 3/04 |
| CN | 101331312 A | 12/2008 | ............ | F02M 47/02 |
| DE | 242680 A1 | 2/1987 | ............ | G01L 19/14 |
| DE | 10007733 A1 | 8/2001 | ............ | F02M 51/06 |
| DE | 102004044811 A1 | 3/2006 | ............ | F02M 51/00 |
| DE | 102005008972 A1 | 8/2006 | ............ | F02M 51/06 |
| DE | 102005008973 A1 | 8/2006 | ........ | F02M 51/0603 |
| DE | 102005015733 A1 | 10/2006 | ............ | F02M 51/06 |
| DE | 102005016795 A1 | 10/2006 | ............ | F02M 51/06 |
| DE | 102005040914 A1 | 3/2007 | ............ | F02M 51/04 |
| DE | 102006043027 A1 | 3/2008 | ........... | H01L 41/053 |
| DE | 102007016626 A1 | 10/2008 | ................ | B05B 1/00 |
| DE | 102008047385 A1 | 3/2010 | ............ | F02M 45/08 |
| DE | 102009027504 A1 | 1/2011 | ............ | F02M 47/02 |
| DE | 102009039647 A1 | 3/2011 | ............ | F02M 47/02 |
| DE | 102010040874 A1 | 3/2012 | ............ | F02M 47/02 |
| EP | 1637727 A1 | 3/2006 | ............ | F02M 59/46 |
| JP | 54010262 A | 1/1979 | ............ | B21C 23/08 |
| JP | 5245522 A | 9/1993 | ............ | B21B 39/00 |
| JP | 2000506590 A | 5/2000 | ............ | F02M 47/02 |
| JP | 2003097418 A | 4/2003 | ............ | F02M 51/00 |
| JP | 2010003980 A | 1/2010 | ............ | F02M 51/00 |
| JP | 2010506412 A | 2/2010 | ............ | F02M 51/00 |
| WO | 2005/050002 A1 | 6/2005 | ............ | F02M 51/06 |
| WO | 2005/095787 A1 | 10/2005 | ............ | F02M 45/08 |
| WO | 2006/008200 A1 | 1/2006 | ............ | F02M 51/06 |
| WO | 2010/142753 A1 | 12/2010 | ............ | F02M 51/06 |
| WO | 2010/142767 A1 | 12/2010 | ............ | F02M 51/06 |
| WO | 2014/009228 A2 | 1/2014 | ............ | F02M 51/06 |
| WO | 2014/009237 A1 | 1/2014 | ............ | F02M 51/06 |

OTHER PUBLICATIONS

International Search Report and Written Opinion, Application No. PCT/EP2013/064106, 9 pages, dated Sep. 2, 2013.
International Search Report and Written Opinion, Application No. PCT/EP2013/064074, 15 pages, dated Jan. 30, 2014.
Chinese Office Action, Application No. 201380037483.6, 12 pages, dated Jul. 4, 2016.
U.S. Non-Final Office Action, U.S. Appl. No. 14/414,686, 28 pages, dated Sep. 30, 2016.
U.S. Final Office Action, U.S. Appl. No. 14/414,686, 24 pages, dated Nov. 22, 2016.
U.S. Non-Final Office Action, U.S. Appl. No. 14/414,686, 27 pages, dated Feb. 15, 2017.
U.S. Final Office Action, U.S. Appl. No. 14/414,686, 27 pages, dated May 17, 2017.
U.S. Notice of Allowance, U.S. Appl. No. 14/414,686, 9 pages dated Sep. 15, 2017.

METHOD FOR PRODUCING A SOLID ACTUATOR

CROSS-REFERENCE TO RELATED APPLICATIONS

This application is a U.S. National Stage Application of International Application No. PCT/EP2013/064074 filed Jul. 3, 2013, which designates the United States of America, and claims priority to DE Application No. 10 2012 212 264.8 filed Jul. 13, 2012, the contents of which are hereby incorporated by reference in their entirety.

TECHNICAL FIELD

The invention relates to a method for producing a solid-state actuator which is used in particular in a fluid injector and which may for example be a piezoelectric actuator. Fluid injectors of said type are used for example in internal combustion engines for the metering of fuel. With regard to high demands placed on internal combustion engines used in motor vehicles, for example with regard to highly targeted performance adjustment and/or adherence to stringent pollutant emissions regulations, precise metering of the fluid by means of the respective fluid injector is important.

BACKGROUND

In this context, fluid injectors with solid-state actuators are used in particular also in diesel internal combustion engines. The fluid to be metered is often, for example in the case of diesel, supplied to the fluid injector at a feed pressure of up to approximately 2500 bar, and then metered into the respective combustion chamber of the internal combustion engine by means of the fluid injector.

The solid-state actuator comprises an actuator structural unit, and in this regard, with regard to high efficiency, it is important for the actuator structural unit to be preloaded with a force which is dependent on its cross section. Through the provision of a predefined preload force, it is also possible to realize adequate endurance capability.

Furthermore, the actuator structural unit in the fluid injector is generally protected against contact with fuel in order to prevent damage to an insulator or to electrical contact means.

In this context, it is known, for example in the case of an actuator structural unit in the form of a piezo stack, for the preload to be predefined by means of a tubular spring. Sealing is realized by means of a diaphragm which is welded onto an injector body and onto a base plate of the actuator structural unit.

SUMMARY

One embodiment provides a method for producing a solid-state actuator having an actuator structural unit, a top plate and a base plate, in which method a hollow cylindrical part composed of maraging steel is provided, the hollow cylindrical part is heated to a predefined first temperature at which the maraging steel is in an austenitic state, a corrugated tube is shaped out of the hollow cylindrical part by means of a deformation process while the maraging steel is in an austenitic state, the corrugated tube is cooled such that the maraging steel is in a martensitic state, the actuator structural unit is inserted into the corrugated tube, and the top plate and the base plate are fixed to the corrugated tube such that the actuator structural unit is braced between the top plate and the base plate with a predefined preload.

In a further embodiment, the first temperature lies in a range between 700 and 950° C.

In a further embodiment, after the deformation process, the corrugated tube is firstly cooled until a predefined condition is met, and subsequently the corrugated tube is heated again and age-hardened in a predefined temperature range for a predefined time duration.

In a further embodiment, the predefined temperature range for the age-hardening lies between 400° C. and 500° C.

In a further embodiment, the deformation process encompasses the insertion of the hollow cylindrical part into a mold part and charging of the hollow cylindrical part, in its free interior space, with a predefined gas pressure.

BRIEF DESCRIPTION OF THE DRAWINGS

Example embodiments of the invention are explained in more detail below with reference to the drawings, in which.

DETAILED DESCRIPTION

Figure 1:
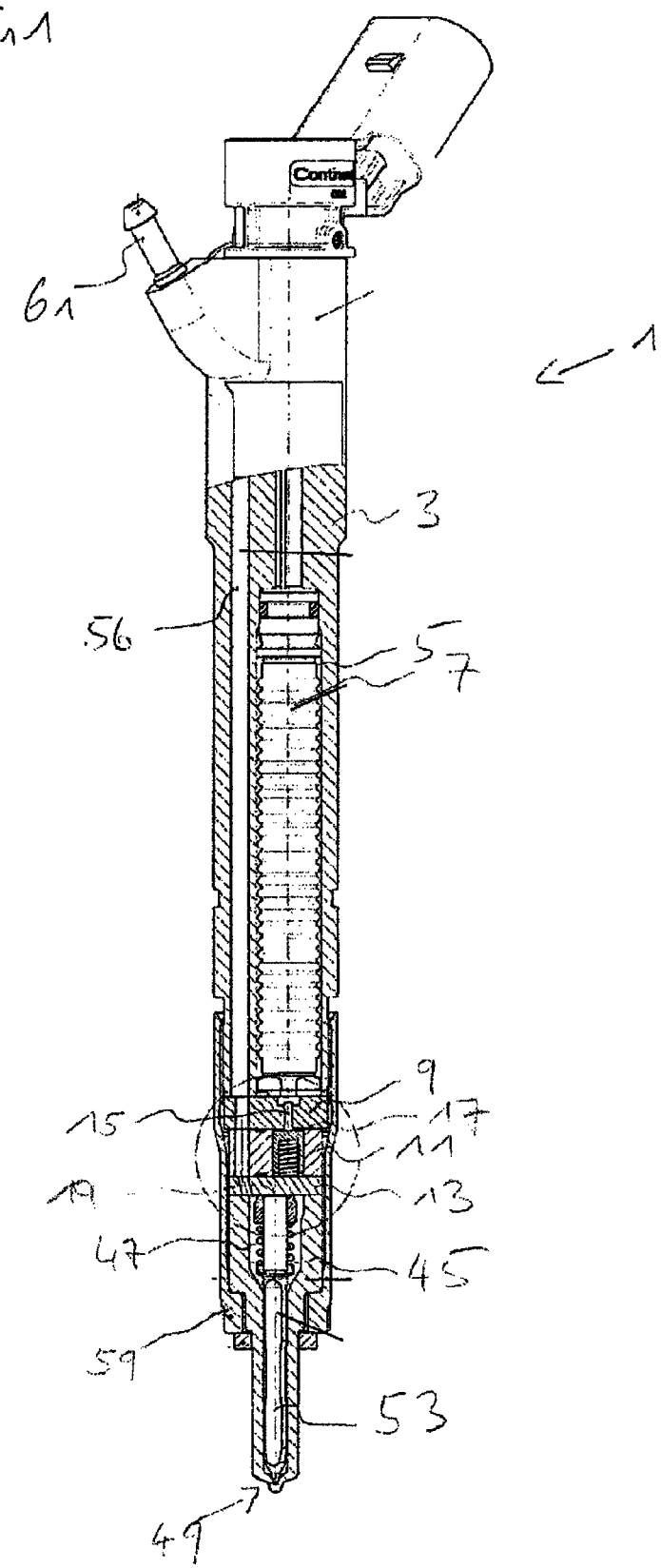
FIG. 1 shows a partial cross section through a fluid injector with a solid-state actuator.

Embodiments of the invention provide a method for producing a solid-state actuator, by means of which method a solid-state actuator is produced which contributes to reliable operation even in the case of very restricted installation space availability.

One embodiment provides method for producing a solid-state actuator having an actuator structural unit, a top plate and a base plate. A hollow cylindrical part composed of maraging steel is provided. The expression "maraging" is a combination of the words "martensite" and "aging" and is generally used for martensitically hardenable steel.

The hollow cylindrical part is thus of tubular form, in particular in the form of a tube piece.

The hollow cylindrical part is heated to a predefined first temperature at which the maraging steel is in an austenitic state. A corrugated tube is shaped out of the hollow cylindrical part by means of a deformation process while the maraging steel is in an austenitic state. The corrugated tube is subsequently cooled such that the maraging steel is in a martensitic state.

The actuator structural unit is inserted into the corrugated tube. The top plate and the base plate are fixed to the corrugated tube such that the actuator structural unit is braced between the top plate and the base plate with a predefined preload. In this case, the preload is predefined for a predefined temperature, for example room temperature, and a predefined state of the actuator structural unit, in particular a state of charge, which may correspond to a neutral state.

In this way, it is possible, in particular even in the case of large actuator strokes, to ensure high reliability and, in particular, high life-cycle durability. By contrast to a solution in which sealing in a fluid injector is realized by means of a diaphragm which is welded to the base plate and to an injector body of the fluid injector, the problem of a load capacity threshold of said diaphragm being exceeded is eliminated. This is advantageous in particular in the case of the solid-state actuator being used in a fluid injector in which a hydraulic play compensation means is provided and differences in thermally induced changes in length between the solid-state actuator and the injector body arise as, so to speak, a steady-state stroke and thus as a load on the component which performs the sealing function with regard to the fluid.

Through the provision of the actuator structural unit in the corrugated tube and the fixing of the top plate and the base plate to the corrugated tube, wherein the actuator structural unit is braced between the top plate and the base plate with the predefined preload, it is possible, in particular in conjunction with a fixing means which fixes the base plate and/or the top plate sealingly to the corrugated tube, to ensure that the actuator structural unit is separated in hermetically sealed fashion from the fluid, which is in particular fuel.

Furthermore, by means of this approach, the corrugated tube can be shaped such that it realizes a required spring constant, without exceeding admissible stresses in order to realize life-cycle durability. Design parameters of the corrugated tube available for this purpose are in particular a wall thickness, a corrugation period and an amplitude of the corrugated tube.

As a result of the provision of the maraging steel in conjunction with the above-mentioned steps during the production of the solid-state actuator, it is possible during the deformation process to realize plastic deformation, specifically from the shape of the hollow cylindrical part to the corrugated tube, in a particularly expedient manner.

By means of the subsequent cooling of the corrugated tube such that the maraging steel is in the martensitic state, specifically in particular is for the most part in the martensitic state, it is possible to realize a very high strength. Furthermore, by means of this approach, it is possible to produce the corrugated tube with the required characteristics even in the case of very restricted installation space availability.

In one embodiment, the first temperature lies in a range between 700 and 950° C. In this temperature range, with the first temperature in the stated range, the maraging steel is changed into the austenitic state. In this state, the plastic deformation capability is very high, for example greater than 30%.

In a further embodiment, after the deformation process, the corrugated tube is firstly cooled until a predefined condition is met. The predefined condition may for example be met when a predefined second temperature, which may for example correspond approximately to room temperature, is approximately reached. Subsequently, the corrugated tube is heated again and age-hardened in a predefined temperature range for a predefined time duration. The time duration may for example lie in a range from two to four hours. The predefined temperature range for the age-hardening particularly advantageously lies between 400 and 500° C., in particular between 450 and 480° C. After the initial cooling to the second temperature, which in particular corresponds approximately to room temperature, the microstructure of the maraging steel changes for the most part into the martensitic state. Owing to the age-hardening, also referred to as aging, the martensite formation is completed, and a particularly high strength can be attained, which may for example reach values of 2000 MPa.

In a further embodiment, the deformation process encompasses the insertion of the hollow cylindrical part into a mold part and charging of the hollow cylindrical part, in its free interior space, with a predefined gas pressure. The gas pressure lies in a range of approximately 700 bar. In this context, nitrogen is preferably used as the gas.

The fluid injector 1 has an injector body which is formed basically in one piece but preferably in multiple pieces. Accordingly, in a multi-piece form, the injector body comprises an injector body part 3, an intermediate plate 9, a control plate 11 and an end plate 13.

The injector body part 3 has an actuator recess 5 into which a solid-state actuator 7 is inserted. The solid-state actuator 7 is for example in the form of a piezoelectric actuator, and is an electromagnetic transducer.

If appropriate, the injector body, in particular the injector body part 3, need not necessarily perform a temperature compensation function, and may thus be manufactured from a material which can be optimized with regard to high-pressure resistance.

In particular, in the control plate 11, there is formed a control piston unit recess in which a control piston unit is arranged.

Furthermore, in the intermediate plate, there is provided a transmission pin recess which extends through said intermediate plate in particular axially, specifically to the control piston unit recess. In the transmission pin recess, a transmission pin is arranged so as to extend through the transmission pin recess and mechanically couple the solid-state actuator 7 to the control piston unit.

The control piston unit delimits a first control chamber 17. The first control chamber 17 is hydraulically coupled to a second control chamber 19, specifically via a connecting bore.

Furthermore, a nozzle body 45 is provided which has a nozzle body recess 47. Proceeding from the nozzle body recess 47, one or more injection holes are formed in a region 49 of a nozzle tip, said injection holes extending through the nozzle body 45 from the nozzle body recess 47 to the outside. In the nozzle body recess 47 there is arranged a nozzle needle 53 which, by way of a face surface facing away from the nozzle tip, delimits the second control chamber 19. The nozzle needle 53 is arranged in axially movable fashion in the nozzle body recess 47, specifically in such a way that, in a closed position, it prevents a flow of fluid through the one or more injection holes, and otherwise permits such a fluid flow. Furthermore, a feed bore 56 is provided in the injector body part 3 and in the intermediate plate 9, the control plate 11 and in the end plate 13, which feeder bore is hydraulically coupled to a fluid port 61 which is hydraulically coupled, during operation, to a fluid supply by means of which the fluid to be metered is supplied at feed pressure to the fluid injector 1 during the operation of the latter.

The nozzle body 45 is coupled to the injector body by means of a nozzle clamping nut 59. The nozzle clamping nut 59 may for example be fixedly fastened to the injector body, in particular to the injector body part 3, by means of a welded connection.

Figure 2:
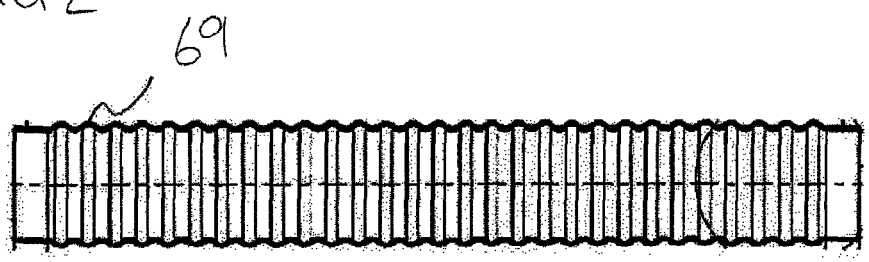
FIG. 2 shows a corrugated tube.
Figure 3:
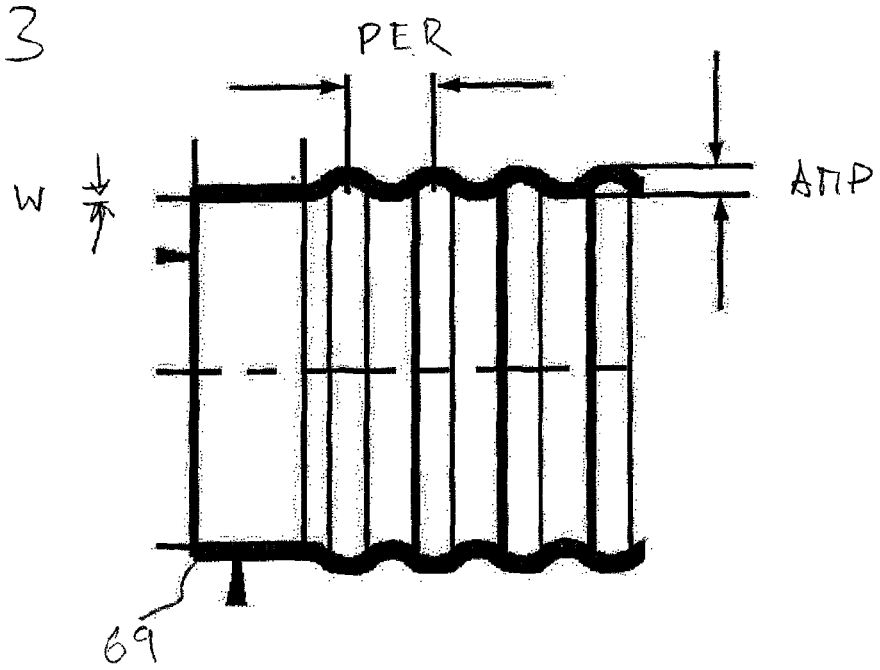
FIG. 3 shows an enlarged detail of the corrugated tube as per FIG. 2.
Figure 4:
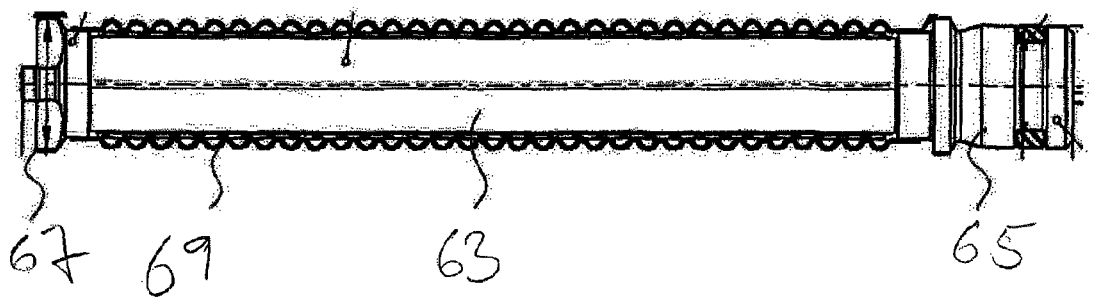
FIG. 4 shows the solid-state actuator.

The solid-state actuator 7 comprises a corrugated tube 69 (FIG. 2). The corrugated tube 69 is produced from a maraging steel. Maraging steels exhibit high strength and good ductility. They comprise substantially carbon-free alloys and are alloyed with a high nickel fraction, for example of greater than 12%. They also possibly contain further alloy elements such as for example aluminum, molybdenum, copper, niobium, cobalt and/or titanium. Design parameters of the corrugated tube 69 are, aside from the material, a wall thickness W, a corrugation period PER and a corrugation amplitude AMP. In the case of an outer diameter of for example 9.2 mm, the wall thickness may for example be approximately 0.2 mm, the corrugation amplitude AMP approximately 0.4 mm and the corrugation period approximately 2 mm. Accordingly, it is possible to realize a spring constant of for example 1.8 N/μm at a preload force of approximately 800 N in the fully produced solid-state actuator 7 at a predefined temperature and in a predefined state of the actuator structural unit, in particular state of charge. This is in particular a neutral state, in which the actuator structural unit is substantially discharged.

The corrugated tube has for example a length of 63 mm.

The actuator structural unit is preferably a piezo actuator, in particular a piezo stack.

In addition to the actuator structural unit 63, the solid-state actuator comprises the corrugated tube 69, a top plate 65 and a base plate 67.

Figure 5:
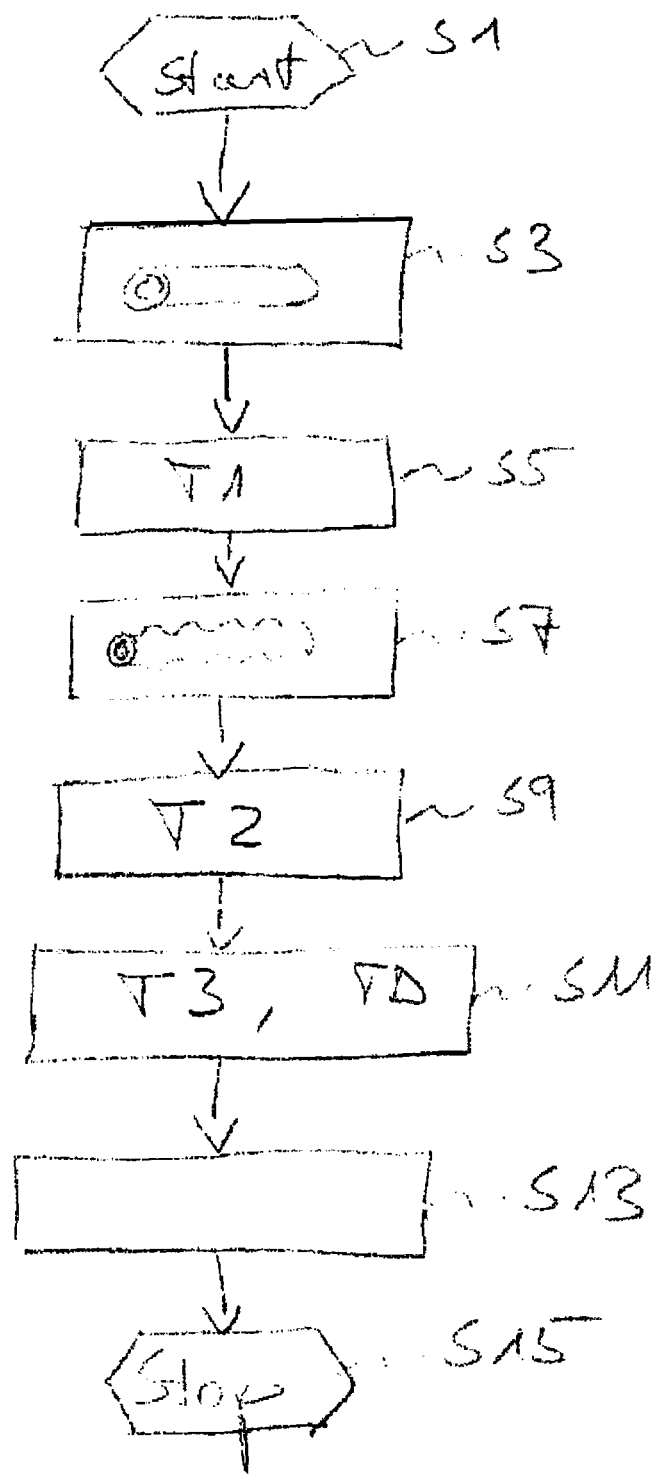
FIG. 5 shows a flow diagram of the production of the solid-state actuator.

Production of the solid-state actuator 7 will be described below on the basis of the flow diagram in FIG. 5. The production starts in a step S1. In a step S3, a hollow cylindrical part composed of maraging steel is provided.

In a step S5, the hollow cylindrical part is heated to a predefined first temperature T1, at which the maraging steel is in an austenitic state. The first temperature preferably lies in a range between 700 and 950° C., and is in particular for example 850° C.

In a step S7, a corrugated tube 69 is shaped out of the hollow cylindrical part by means of a deformation process while the maraging steel is in the austenitic state. For this purpose, the hollow cylindrical part is inserted into a mold part, the radially internal contour of which corresponds to the external contour of the corrugated tube 69. The hollow cylindrical part is then charged, in its free interior space, with a predefined gas pressure which is for example in a range from 600 to 800 bar, and is in particular approximately 700 bar, said charging preferably being realized using nitrogen. In this way, the external contour is adapted to the internal contour of the mold part, and the corrugated tube 69 is thus formed.

In this context, it must be stated that, at suitably high temperatures, particularly good deformability of the maraging steel, which is then in the austenitic state, is possible. At lower temperatures at which the austenitic state still prevails, which is generally the case at temperatures above approximately 200° C., it is basically possible for the hollow cylindrical part to be deformed to form the corrugated tube. However, a deformation is possible in a particularly advantageous manner in the temperature range specified above.

In a step S9, the corrugated tube 69 is cooled until a predefined condition is met. The predefined condition is for example predefined such that approximately room temperature, for example approximately 20° C., is reached.

Subsequently, in a step S11, age-hardening of the maraging steel is performed, specifically by virtue of the corrugated tube 69 being heated again to a predefined third temperature T3 which lies in a temperature range of for example between 400° C. and 500° C., in particular between 450° C. and 480° C. In said temperature range, the corrugated tube 69 is then exposed to said temperatures for a predefined time duration TD of for example two to four hours. This approach is also referred to as aging and leads to completion of the martensite formation. It is thus possible to attain very high strength values, which may for example have a value of greater than or equal to 2000 MPa.

In a step S13, the actuator structural unit 63 is inserted into the corrugated tube 69. Furthermore, the top plate 65 and the base plate 67 are fixed in the corrugated tube 69 such that the actuator structural unit 63 is braced with a predefined preload between the top plate 65 and the base plate 67. The preload is specified for a predefined temperature, which corresponds for example approximately to room temperature, and for a predefined state of the actuator structural unit 63, which in particular corresponds to the neutral state. The preload is for example approximately 800 N.

The fixing of the top plate 65 and of the base plate 67 may be realized for example by means of welding, for example by means of laser welding. The fixing is performed such that the actuator structural unit 63 is sealed off from the surroundings of the solid-state actuator 7 in hermetically sealed fashion. The process is then ended in step S15.

What is claimed is:

1. A method for producing a solid-state actuator having an actuator structural unit, a top plate and a base plate, the method comprising:
   providing a hollow cylindrical part formed from maraging steel,
   heating the hollow cylindrical part to a predefined first temperature at which the maraging steel is in an austenitic state,
   shaping a corrugated tube out of the hollow cylindrical part using a deformation process while the maraging steel is in an austenitic state,
   cooling the corrugated tube such that the maraging steel is in a martensitic state,
   inserting the actuator structural unit into the corrugated tube, and
   fixing the top plate and the base plate to the corrugated tube such that the actuator structural unit is braced between the top plate and the base plate with a predefined preload.

2. The method of claim 1, wherein the first temperature lies in a range between 700 and 950° C.

3. The method of claim 1, comprising, after the deformation process, cooling the corrugated tube until a predefined condition is met, and subsequently heating and age-hardening the corrugated tube in a predefined temperature range for a predefined time duration.

4. The method of claim 3, wherein the predefined temperature range for the age-hardening is between 400° C. and 500° C.

5. The method of claim 1, wherein the deformation process includes inserting the hollow cylindrical part into a mold part and charging a free interior space of the hollow cylindrical part with a predefined gas pressure.

* * * * *